United States Patent
Boschker et al.

(10) Patent No.: US 12,002,859 B2
(45) Date of Patent: Jun. 4, 2024

(54) SEMICONDUCTOR DEVICE AND METHOD FOR PRODUCING A SUBSTRATE FOR A SEMICONDUCTOR COMPONENT, AND USE OF INDIUM DURING PRODUCTION OF SAME

(71) Applicants: JENOPTIK Optical Systems GmbH, Jena (DE); Forschungsverbund Berlin e.V., Berlin (DE)

(72) Inventors: Jos Boschker, Berlin (DE); Christiane Frank-Rotsch, Oberkraemer (DE); Thomas Schroeder, Berlin (DE); Martin Zorn, Berlin (DE)

(73) Assignees: Jenoptik Optical Systems GmbH, Jena (DE); Forschungsverbund Berlin e.V., Berlin (DE)

( * ) Notice: Subject to any disclaimer, the term of this patent is extended or adjusted under 35 U.S.C. 154(b) by 0 days.

(21) Appl. No.: 18/039,668

(22) PCT Filed: Nov. 24, 2021

(86) PCT No.: PCT/EP2021/082758
§ 371 (c)(1),
(2) Date: May 31, 2023

(87) PCT Pub. No.: WO2022/117405
PCT Pub. Date: Jun. 9, 2022

(65) Prior Publication Data
US 2023/0352543 A1    Nov. 2, 2023

(30) Foreign Application Priority Data

Dec. 1, 2020 (DE) .................... 10 2020 131 850.2

(51) Int. Cl.
*H01L 21/00* (2006.01)
*H01L 21/02* (2006.01)
(Continued)

(52) U.S. Cl.
CPC ...... *H01L 29/207* (2013.01); *H01L 21/02395* (2013.01); *H01L 21/02433* (2013.01); *H01L 29/045* (2013.01)

(58) Field of Classification Search
CPC ............. H01L 29/207; H01L 21/02395; H01L 21/02433; H01L 29/045
See application file for complete search history.

(56) References Cited

U.S. PATENT DOCUMENTS 4,594,173 A * 6/1986 Hobgood ................ C30B 15/00
                                                         117/17
8,994,071 B2    3/2015 Miller et al.

FOREIGN PATENT DOCUMENTS

| CN | 101192517 A | 6/2008 |
| CN | 102804411 A | 11/2012 |
| DE | 35 14 294 A1 | 10/1985 |

OTHER PUBLICATIONS

International Search Report for International Application No. PCT/EP2021/082758 dated Feb. 8, 2022 with Eng Trans.

(Continued)

*Primary Examiner* — Richard A Booth
(74) *Attorney, Agent, or Firm* — Muncy, Geissler, Olds & Lowe, P.C.

(57) ABSTRACT

A semiconductor device comprising a substrate and an aluminium gallium arsenide-based semiconductor component, the substrate being monocrystalline, and the substrate having a gallium indium arsenide mixed crystal with the empirical formula $GA_{(1-x)}In_{(x)}As$, the indium content x being between 0.1 percent and 4 percent.

13 Claims, 3 Drawing Sheets

(51) Int. Cl.
    *H01L 29/04*        (2006.01)
    *H01L 29/207*      (2006.01)

(56) References Cited

OTHER PUBLICATIONS

German Office Action for German Application No. 10 2020 131 850.2 dated Jul. 5, 2021, English translation.
Hayakawa et al., "Growth of InGaAs tertiary bulk crystals by rotational Brigman method," J. of Crystal Growth, vol. 275, Nos. 1-2, pp. e421-e425 (Feb. 15, 2005).
Hoke et al., "Improved pseudomorphic high electron mobility transister structures on InGaAs substrates," AIP, J. of Appl. Phys., vol. 81, No. 2, pp. 968-973 (Jan. 15, 1997).
Nishijima et al., "InGaAs zone growth single crystal with convex solid-liquid interface toward the melt," J. of Crystal Growth, vol. 245, No. 3-4, pp. 228-236 (Nov. 2002).
Wikipedia, "Gallium arsenide," at https://de.wikipedia.org/Wiki/Galliumarsenide in English, pp. 1-5 (Dec. 1, 2022).

* cited by examiner

SEMICONDUCTOR DEVICE AND METHOD FOR PRODUCING A SUBSTRATE FOR A SEMICONDUCTOR COMPONENT, AND USE OF INDIUM DURING PRODUCTION OF SAME

This nonprovisional application is a National Stage of International Application No. PCT/EP2021/082758, which was filed on Nov. 24, 2021, and which claims priority to German Patent Application No. 10 2020 131 850.2, which was filed in Germany on Dec. 1, 2020, and which are both herein incorporated by reference.

BACKGROUND OF THE INVENTION

Field of the Invention

The invention relates to a semiconductor device having a substrate and an aluminum gallium arsenide-based semiconductor component and to a method of producing a substrate for a semiconductor component and to use of indium as an addition in the production of a substrate.

Description of the Background Art

In conventional methods, bending of a wafer or stress in a final semiconductor structure, for example, may have to be accepted. If the thickness of the structure is defined by the design and cannot be reduced on account of the required properties of the semiconductor component, it is possible to incorporate stress compensation into the epitaxial layers. Such compensation may especially be effected by means of suitable intermediate layers, for example aluminum indium gallium phosphide, or an addition of small amounts of phosphorus to aluminum gallium arsenide. Conventional examples of addition of indium in gallium arsenide crystals relates more particularly to the reduction of dislocation density or 'hardening' of the crystal in the production of undoped gallium arsenide substrate crystals, especially by means of the Czochralski crystal growing method (LEC: liquid-encapsulated Czochralski: specific form of the Czochralski method with employment of pressure and covering of the molten crystal surface with boron oxide $B_2O_3$; see, for example, DE3514294A1). For example, indium gallium arsenide solid solutions with indium concentrations of more than 20 percent are used in order to achieve lasers, especially quantum well lasers, with wavelength ranges of 1.2 to 1.3 micrometers, or to achieve a longer emission wavelength than is normally possible with GaAs substrates (630-1200 nanometers).

SUMMARY OF THE INVENTION

Against this background, by the approach presented here, a semiconductor component, a semiconductor device having such a substrate and a method of producing a substrate for a semiconductor component according to the main claims are presented. Advantageous configurations and developments of the invention will be apparent from the subsidiary claims that follow.

According to embodiments, especially in the case of a substrate for a semiconductor component, a solid solution may be used, more specifically a GaAs substrate crystal, the lattice constant of has been or may have been adjusted in a controlled manner by addition of indium to aluminum gallium arsenide-based components. It is possible here, for example, to master challenges owing to different lattice constants between substrate and epitaxial layers of the semiconductor component not by the conventional route of adaptation of the epitaxial layers but instead by adaptation of the substrate. In other words, a reduction in substrate bending can be achieved by controlling mechanical stress in the epitaxial layers by means of adjustment of the lattice parameter of the substrate.

It is thus especially possible to achieve production of aluminum gallium arsenide-based components with very high thickness in an advantageous manner. In other words, production of, for example, stacked laser diodes or semiconductor lasers having high layer thicknesses of the waveguide layers and outer layers may be enabled, for example nanostacks or laser stacks that can be used in LIDAR systems. For avoidance of bending or stress, in embodiments, it is possible to dispense with any introduction of stress-compensating layers, such that there is no need to accept any disadvantages in other properties of the semiconductor component, for example in series resistance and efficiency. It is also possible to avoid stress compensation by adding phosphorus to aluminum gallium arsenide during growth, the opportunities for which may in principle be limited, since excessively high amounts could lead to stress-induced crystal defects.

A substrate for a semiconductor component is presented, wherein the substrate is monocrystalline, wherein substrate includes a gallium indium arsenide solid solution having the empirical formula $Ga_{(1-x)}In_{(x)}As$ where the indium content x is between 0.1 percent and 4 percent.

The substrate may be designed to bear the semiconductor component and/or to function as carrier unit for the semiconductor component. Gallium indium arsenide may also be referred to as indium gallium arsenide.

A substrate configured in such a way offers the advantage of a very stable position which is further notable for low bending characteristics.

Advantageously, the indium content x may be between 0.2 percent and 2 percent. Such an embodiment affords a particularly stable substrate having low bending characteristics.

In one embodiment, the substrate may take the form of a wafer with a <100> crystal orientation. Such an embodiment offers the advantage firstly of giving a stable substrate and secondly of allowing particularly good introduction of the desired substances into the substrate, in order to implement the advantages of the approach presented here.

The <100> crystal orientation may be the preferred crystal orientation here.

It is also possible here for the substrate to be off-oriented at an angle between 0 degrees and 10 degrees to the <100> crystal orientation.

In one embodiment, the substrate the substrate may take the form of a wafer having a <110> crystal orientation, a <111> crystal orientation, a <211> crystal orientation or a <311> crystal orientation. In other words, the surface of the substrate is aligned in <110> crystal orientation, a <111> crystal orientation, a <211> crystal orientation or a <311> crystal orientation of the solid solution.

In addition, the substrate may be doped with silicon, tellurium, selenium, sulfur, zinc, boron and/or carbon. Such an embodiment offers the advantage firstly of achieving particularly stable characteristics of the substrate and secondly of being able to advantageously precisely establish desired electrical or mechanical properties.

It is also possible for the substrate to be n-conductive or p-conductive. Additionally or alternatively, it is possible here for an n-dopant concentration and/or a p-dopant concentration of the substrate to be within a range from $10^{16}$ to $10^{20}$ per cubic centimeter.

Also presented is a semiconductor device having the following features:
- an embodiment of the aforementioned substrate; and
- at least one semiconductor component having an epitaxially produced semiconductor layer sequence, wherein the semiconductor component is disposed on the substrate.

The semiconductor component here may have been secured, applied or fixed on the substrate. The semiconductor device may, for example, be a semiconductor laser or the like.

In one embodiment, the semiconductor layer sequence of the semiconductor component may include at least one stressed layer. In particular, the stressed layer here may include gallium aluminum arsenide having the empirical formula $Ga_{(y)}Al_{(1-y)}As$. Gallium aluminum arsenide may also be referred to as aluminum gallium arsenide. "Stressed" may be understood here to mean mechanically stressed.

It is also possible for the lattice parameter of the substrate to be matched to the lattice parameter of the semiconductor layer sequence of the semiconductor component, or for the lattice parameter of the substrate to be adjusted by means of the indium content x such that the semiconductor layer sequence is unstressed overall. It is thus possible for the substrate with the layer structure or layer sequence to be planar, or to prevent bending.

Alternatively, the lattice parameter of the substrate may be matched to the lattice parameter of the semiconductor layer sequence of the semiconductor component, or the lattice parameter of the substrate may be adjusted by means of the indium content x such that the semiconductor layer sequence is under a predetermined mechanical stress.

In addition, the semiconductor component may be executed as a laser diode, as a light-emitting diode, as a phototransistor, as a photothyristor, as a field-effect transistor or as a Schottky diode.

Moreover, the semiconductor device may include a multitude of semiconductor components in a stacked arrangement. In this way, it is possible to achieve what is called a nanostack.

Process for producing one embodiment of the aforementioned substrate for a semiconductor component, wherein the solid solution of the substrate is grown in one step primarily by the VGF method (VGF=vertical gradient freeze).

The VGF method is a crystal growing method. Alternatively, the solid solution may also be manufactured by another method of crystal growing; possible embodiments here are both those of the Czochralski methods and of further Bridgman methods, executed horizontally or vertically. Using the VGF growth method, it is possible to reduce the dislocation density in the crystal to a particular degree.

A further aspect of the invention is the use of indium as an addition in the production of a monocrystalline substrate for adjustment of the lattice constant of the substrate to an epitaxial semiconductor layer sequence provided on the substrate in at least one semiconductor component intended for production on the substrate. It is possible here for the substrate to advantageously include a gallium indium arsenide solid solution having the empirical formula $Ga_{(1-x)}In_{(x)}As$ where the indium content x is between 0.1 percent and 4 percent. Particularly advantageously, the semiconductor layer sequence on the substrate may be unstressed overall. This may mean that the lattice constant of the substrate is equal to the effective lattice constant of the semiconductor layer sequence. As a result, the substrate with the layer structure or semiconductor layer sequence may be planar or bending may prevented. This is an advantage of the inventive use of indium.

For example, the effective lattice constant of a gallium arsenide/gallium aluminum arsenide semiconductor layer sequence can be determined by means of the aluminum content averaged over the entire layer sequence. The effective lattice constant of the semiconductor layer sequence can also be determined experimentally by first removing the substrate and then measuring the lattice constant of the exposed semiconductor layer sequence. It is also possible to determine the lattice constant of the semiconductor layer sequence from the bending of the substrate with the semiconductor layer sequence. If there is no bending, it can be concluded that the lattice constants of the substrate and the effective lattice constant of the semiconductor layer sequence are the same.

It should be pointed out that, in a semiconductor layer sequence which is unstressed overall, there may quite possibly be one or more stressed layers, the stress on which is compensated for by other layers of the semiconductor layer sequence. The epitaxial semiconductor layer sequence may comprise one or more aluminum-containing layers. Such layers may take the form of doped or undoped gallium aluminum arsenide layers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Working examples of the invention are shown purely schematically in the drawings and are described in detail hereinafter. The figures show.

DETAILED DESCRIPTION

Figure 1:
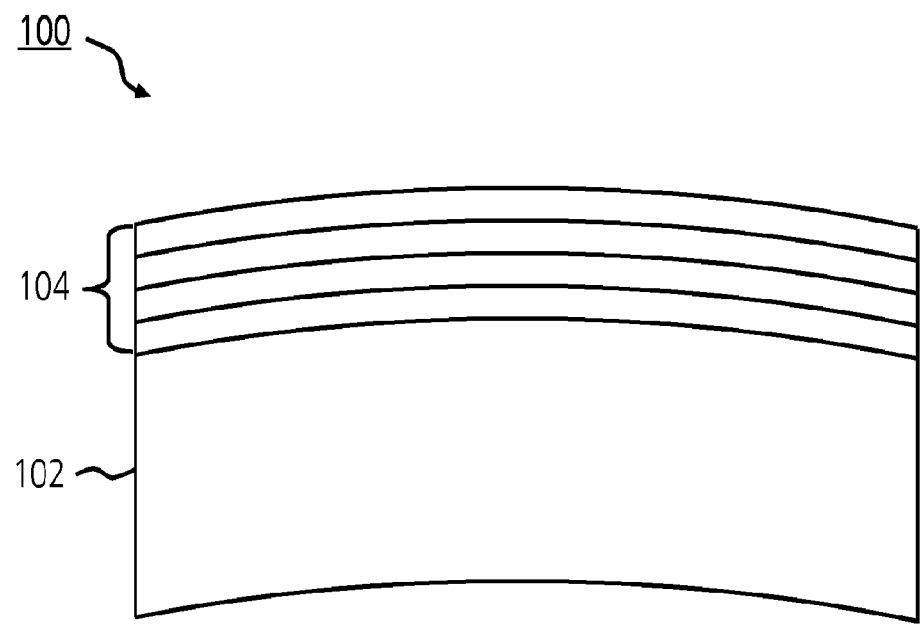
FIG. 1 is a schematic diagram of a semiconductor device.

In the description of favorable working examples of the present invention that follows, identical or similar reference numerals are used for the elements that are shown in the various figures and have a similar effect, without repeated description of these elements.

FIG. 1 shows a schematic diagram of a semiconductor device 100. The semiconductor device 100 comprises a substrate 102, especially a gallium arsenide substrate or GaAs substrate, and a component 104, especially an aluminum gallium arsenide-based component or AlGaAs component. The component 104 is executed as a layer stack on the substrate 102. Also apparent in FIG. 1 is bending of the substrate 102 or of the entire semiconductor device 100.

Figure 2:
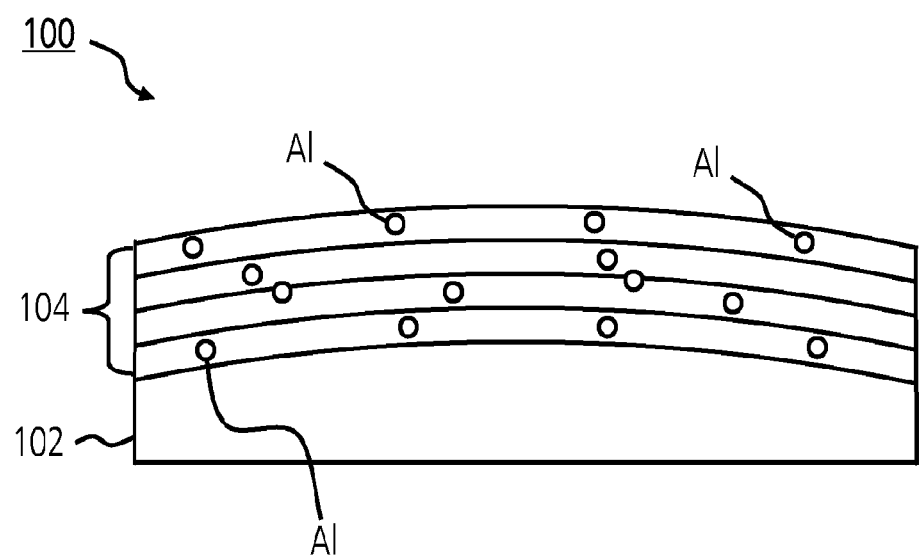
FIG. 2 is a schematic diagram of a semiconductor device.

FIG. 2 shows a schematic diagram of a semiconductor device 100. FIG. 2 shows the semiconductor device 100 from FIG. 1 in the form of a conventional laser diode with a substrate 102 that has been reduced in layer thickness after production. The component 104 here has been doped with aluminum or Al, or aluminum or Al has been added to the layers of the layer stack of component 104. The bending of the component 104 is also apparent in FIG. 2.

Figure 3:
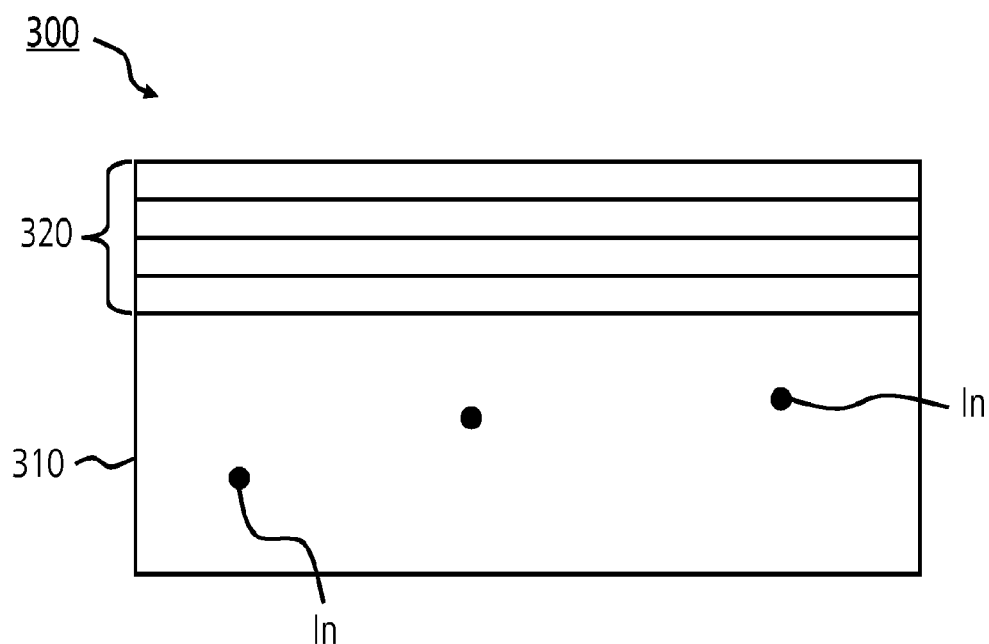
FIG. 3 is a schematic diagram of a working example of a semiconductor device.

FIG. 3 shows a schematic diagram of a working example of a semiconductor device 300. The semiconductor device 300 comprises a substrate 310 and a semiconductor component 320. The component 320 here is executed as an aluminum gallium arsenide-based component or component based on aluminum gallium arsenide or gallium aluminum arsenide. The substrate 310 is an indium gallium arsenide substrate or gallium indium arsenide substrate. In the diagram of FIG. 3, an addition of indium In to gallium arsenide in the substrate 310 is illustrated symbolically.

The semiconductor component 320 is executed as a laser diode merely by way of example. The semiconductor component 320 may alternatively be executed as a light-emitting diode, as a phototransistor, as a photothyristor, as a field-effect transistor or as a Schottky diode. It is also possible for the switching device 300 to alternatively comprise a multitude of semiconductor components 320 in a stacked arrangement.

The substrate 310 is intended for the semiconductor component 320. More specifically, the substrate 310 is designed to bear the semiconductor component 320 or function as a carrier unit for the semiconductor component 320. The semiconductor component 320 comprises an epitaxially produced semiconductor layer sequence. The semiconductor component 320 is disposed on the substrate 310. The substrate 310 is monocrystalline, more specifically a gallium indium arsenide solid solution having the empirical formula $Ga_{(1-x)}In_{(x)}As$. The indium content x is between 0.1 percent and 4 percent.

In one working example, the indium content x is between 0.2 percent and 2 percent. In one variant, the substrate 310 is formed or executed as a wafer having a <100> crystal orientation. Optionally, in this case, the <100> crystal orientation is the preferred crystal orientation of the substrate 310. As desired, the substrate 310 is oriented at an angle between 0 degrees and 10 degrees to the <100> crystal orientation. In a further variant, the substrate 310 is formed or executed as a wafer with a <110> crystal orientation, a <111> crystal orientation, a <211> crystal orientation or a <311> crystal orientation.

In one working example, the substrate 310 has been doped with silicon, selenium, sulfur, zinc, boron and/or carbon. Additionally or alternatively, the substrate 310 is in n-conductive or p-conductive form. It is optionally additionally the case here that there is an n-dopant concentration or a p-dopant concentration of the substrate 310 within a range from $10^{16}$ to $10^{20}$ per cubic centimeter.

The semiconductor layer sequence of the semiconductor component 320, in one working example, comprises at least one stressed layer. In particular, the stressed layer includes aluminum gallium arsenide or gallium aluminum arsenide having the empirical formula $Ga_{(y)}Al_{(1-y)}As$. In one variant, the lattice parameter of the substrate 310 is matched to the lattice parameter of the semiconductor layer sequence of the semiconductor component 320, or the lattice parameter of the substrate 310 is adjusted by means of the indium content x such that the semiconductor layer sequence is unstressed overall. In one variant in each case, the lattice parameter of the substrate 310 is matched to the lattice parameter of the semiconductor layer sequence of the semiconductor component 320, or the lattice parameter of the substrate 310 is adjusted by means of the indium content x such that the semiconductor layer sequence is under a predetermined mechanical stress. This among other topics will be discussed in more detail hereinafter.

Figure 4:
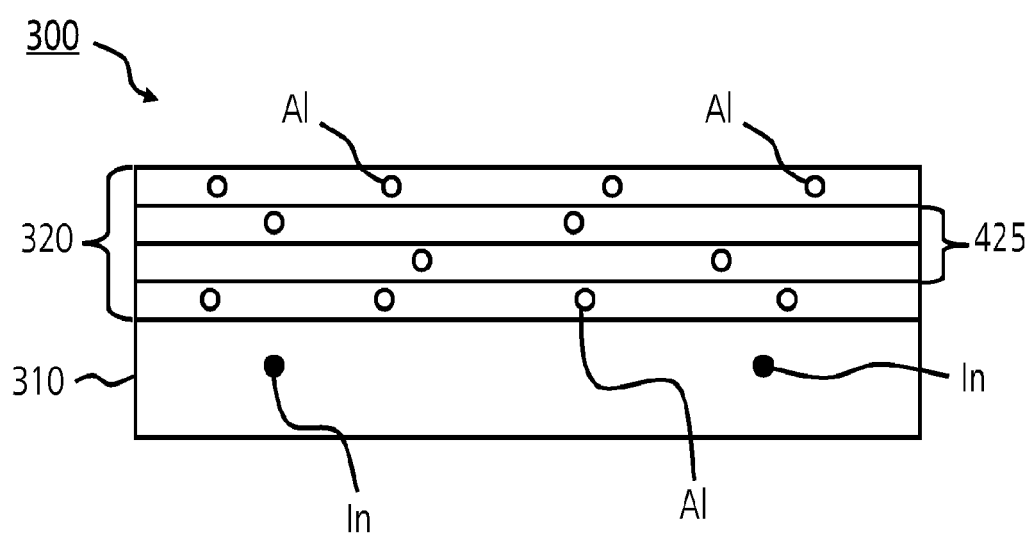
FIG. 4 is a schematic diagram of a working example of a semiconductor device.

FIG. 4 shows a schematic diagram of a working example of a semiconductor device 300. The semiconductor device 300 shown in FIG. 4 corresponds here to the semiconductor device from FIG. 3, except that the substrate 310 has been reduced in layer thickness after conclusion of production and, in addition, light guide layers 425 of the semiconductor sequence of the semiconductor component 320 and an addition of aluminum Al to the semiconductor layer sequence are shown explicitly.

Figure 5:
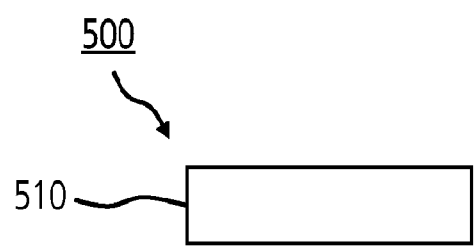
FIG. 5 is a flow diagram of a working example of a process for producing a substrate for a semiconductor component.

FIG. 5 shows a flow diagram of a working example of the process 500 for producing a substrate for a semiconductor component. By executing the method 500 for production, a substrate corresponding to or similar to the substrate from FIG. 3 or FIG. 4 is producible. Thus, by executing the process 500 for production, a substrate for a semiconductor component is producible, wherein the substrate is monocrystalline and includes a gallium indium arsenide solid solution having the empirical formula $Ga_{(1-x)}In_{(x)}As$ where the indium content x is between 0.1 percent and 4 percent. The process 500 has a manufacturing step 510. In the manufacturing step 510, the solid solution of the substrate is manufactured by the VGF crystal growing method (VGF=vertical gradient freeze).

With reference to FIGS. 3 to 5, background information and working examples are briefly described hereinafter additionally and/or once again in summary and by other words.

Optoelectronic components that emit light in the near infrared region are produced on gallium arsenide substrate crystals, GaAs wafers. For guiding of the light waves, waveguide layers and outer layers are produced in edge-emitting semiconductor diode lasers and DBR mirror layers (DBR=distributed Bragg reflector; Bragg mirrors) in surface-emitting semiconductor laser diodes made of aluminum gallium arsenide. This addition of a few up to 100 percent aluminum to gallium arsenide leads to a slight increase in the lattice constant compared to the gallium arsenide substrate crystal. The thicker the aluminum gallium arsenide layers, or the higher the aluminum content, the greater the extent to which the wafer can bend with the laser structure. This avoids disadvantages that are otherwise possible in the processing of the wafer and the properties of the semiconductor laser in working examples.

By addition of small amounts of indium, for example up to 4 percent or 2 percent, to the gallium arsenide crystal during the production process, especially by means of VGF crystal growing methods, for the substrate crystal of the substrate 310, the lattice constant can be matched correspondingly to the epitaxial structure of the semiconductor component 320. At the same time, the substrate crystal can be rendered conductive by n-doping, for example by silicon. Even in the addition of both indium and silicon, there is a difference from conventional solutions. Known solutions with added indium in gallium arsenide crystals, however, relate instead merely to a reduction in dislocation density or 'hardening' of the crystal in the production of undoped gallium arsenide substrate crystals by means of LEC growing methodology (LEC=liquid-encapsulated Czochralski); additions of <0.1% were used here too.

For adjustment of the lattice constant of the substrate crystal at room temperature, the indium content x(In) of the substrate 310, depending on the average aluminum content x(Al) of the epitaxially applied semiconductor structure of the semiconductor component 320 is given by the following relationship:

$$x(In) = \frac{x(Al) * (G_{AlAs} - G_{GaAs})}{G_{InAs} - G_{GaAs}}$$

The lattice constants at room temperature here may be 0.56533 nm for GaAs, 0.56605 nm for AlAs, and 0.60584 nm for InAs. These numerical values give:

$$x(In) = x(Al) * \frac{7.2 * 10^{-3}}{0.4051} = x(Al) * 0.0177734.$$

Smaller or greater values of the indium content x(In) may also lead to a reduction in stress or to the establishment of a desired higher stress. Moreover, the substrate crystal may be rendered conductive by n-doping, for example by silicon.

If a working example includes an "and/or" linkage between a first feature and a second feature, this should be read such that the working example in one embodiment has both the first feature and the second feature and, in a further embodiment, has either the first feature only or the second feature only.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A semiconductor device comprising:
   a substrate,
   wherein the substrate is monocrystalline,
   wherein the substrate includes a gallium indium arsenide solid solution having the empirical formula Ga(1-x)In(x)As, where the indium content x is between 0.1 percent and 4 percent,
   wherein the substrate is produced by a process comprising the manufacturing of a solid solution of the substrate in one step by the vertical gradient freeze (VGF) method for crystal growing; and
   at least one aluminum gallium arsenide-based semiconductor component with an epitaxially produced semiconductor sequence,
   wherein the semiconductor component is disposed on the substrate, and
   wherein the semiconductor component is executed as a laser diode.

2. The semiconductor device as claimed in claim 1, wherein the indium content x of the substrate is between 0.2 percent and 2 percent.

3. The semiconductor device as claimed in claim 1, wherein the substrate takes the form of a wafer with a <100> crystal orientation.

4. The semiconductor device as claimed in claim 1, wherein the substrate is oriented at an angle between 0 degrees and 10 degrees relative to the <100> crystal orientation.

5. The semiconductor device claim 1 wherein substrate takes the form of a wafer having a <110> crystal orientation, a <111> crystal orientation, a <211> crystal orientation or a <311> crystal orientation.

6. The semiconductor device as claimed in claim 1, wherein the substrate is doped with silicon, tellurium, selenium, sulfur, zinc, boron and/or carbon.

7. The semiconductor device as claimed in claim 1, wherein the substrate is n- or p-conductive, and/or wherein an n-dopant concentration and/or a p-dopant concentration of the substrate is within a range from $10^{16}$ to $10^{20}$ per cubic centimeter.

8. The semiconductor device as claimed in claim 1, wherein it is free of stress-compensating layers and/or free of any addition of phosphorus to aluminum gallium arsenide during growth.

9. The semiconductor device as claimed in claim 1, wherein the semiconductor layer sequence of the semiconductor component includes at least one stressed layer, and wherein the stressed layer includes gallium aluminum arsenide having the empirical formula Ga(y)Al(1-y)As.

10. The semiconductor device as claimed in claim 1, wherein the lattice parameter of the substrate is adjusted by means of the indium content x such that the semiconductor layer sequence is unstressed overall.

11. The semiconductor device as claimed in claim 1, wherein the lattice parameter of the substrate is matched to the lattice parameter of the semiconductor layer sequence of the semiconductor component or the lattice parameter of the substrate is adjusted by means of the indium content x such that the semiconductor layer sequence is under a predetermined mechanical stress.

12. The semiconductor device as claimed in claim 1, wherein a multitude of semiconductor components are arranged in a stack.

13. A semiconductor device comprising:
   a monocrystalline substrate, the monocrystalline substrate comprising a gallium indium arsenide solid solution having the empirical formula Ga(1-x)In(x)As, where the indium content x is between 0.2 percent and 2 percent, and
   at least one semiconductor component comprising aluminum gallium arsenide, wherein the at least one semiconductor component having an epitaxially produced semiconductor sequence, wherein the semiconductor component is disposed on the substrate, wherein a substrate lattice constant is equal to a semiconductor layer sequence lattice constant, and wherein the semiconductor component is executed as a laser diode.

* * * * *